(12) United States Patent
Chow et al.

(10) Patent No.: US 10,923,596 B2
(45) Date of Patent: Feb. 16, 2021

(54) CAMOUFLAGED FINFET AND METHOD FOR PRODUCING SAME

(71) Applicant: INSIDE SECURE, Meyreuil (FR)

(72) Inventors: Lap Wai Chow, S. Pasadena, CA (US); Bryan J. Wang, South Lake Tahoe, CA (US); James P. Baukus, Westlake Village, CA (US); Ronald P. Cocchi, Seal Beach, CA (US)

(73) Assignee: RAMBUS INC., San Jose, CA (US)

( * ) Notice: Subject to any disclaimer, the term of this patent is extended or adjusted under 35 U.S.C. 154(b) by 0 days.

(21) Appl. No.: 16/297,516

(22) Filed: Mar. 8, 2019

(65) Prior Publication Data

US 2020/0287040 A1   Sep. 10, 2020

(51) Int. Cl.
*H01L 29/78* (2006.01)
*H01L 29/10* (2006.01)
*H01L 29/08* (2006.01)
*H01L 29/66* (2006.01)
*H01L 21/8234* (2006.01)
*H01L 27/088* (2006.01)

(52) U.S. Cl.
CPC .... *H01L 29/785* (2013.01); *H01L 21/823431* (2013.01); *H01L 21/823437* (2013.01); *H01L 21/823468* (2013.01); *H01L 27/0886* (2013.01); *H01L 29/0847* (2013.01); *H01L 29/1033* (2013.01); *H01L 29/665* (2013.01); *H01L 29/66795* (2013.01)

(58) Field of Classification Search
CPC ............. H01L 29/785; H01L 29/66795; H01L 21/823437; H01L 29/0847; H01L 27/0886; H01L 29/1033
See application file for complete search history.

(56) References Cited

U.S. PATENT DOCUMENTS

| | | | |
|---|---|---|---|
| 5,636,133 A | 6/1997 | Chesebro et al. |
| 5,783,846 A | 7/1998 | Baukus et al. |
| 5,809,281 A | 9/1998 | Steele et al. |
| 5,821,582 A | 10/1998 | Daum |
| 5,866,933 A | 2/1999 | Baukus et al. |
| 5,930,663 A | 7/1999 | Baukus et al. |
| 5,946,478 A | 8/1999 | Lawman |
| 5,973,375 A | 10/1999 | Baukus et al. |
| 6,064,110 A | 5/2000 | Baukus et al. |
| 6,104,639 A | 8/2000 | Hayashi et al. |
| 6,117,762 A | 9/2000 | Baukus et al. |

(Continued)

OTHER PUBLICATIONS

Applicant-Initiated Interview Summary dated Dec. 2, 2019 for U.S. Appl. No. 16/056,268.

(Continued)

*Primary Examiner* — Anthony Ho
(74) *Attorney, Agent, or Firm* — Gates & Cooper LLP

(57) ABSTRACT

A camouflaged FinFET is disclosed. The camouflaged FinFET comprises a fin and a gate, disposed over and perpendicular to the fin. The fin includes a source region of a first conductivity type, a drain region of the first conductivity type, a channel region of a second conductivity type, the channel region disposed between the source region and the drain region, and a camouflaged fin region of the second conductivity type, the camouflaged Fin region at least partially rendering the camouflaged FinFET in an always-on condition and having a planar layout substantially indistinguishable from a fin region of an uncamouflaged FinFET.

20 Claims, 9 Drawing Sheets

(56) References Cited

U.S. PATENT DOCUMENTS

| | | |
|---|---|---|
| 6,294,816 B1 | 9/2001 | Baukus et al. |
| 6,305,000 B1 | 10/2001 | Phan et al. |
| 6,351,172 B1 | 2/2002 | Ouyang et al. |
| 6,459,629 B1 | 10/2002 | Clark, Jr. et al. |
| 6,467,074 B1 | 10/2002 | Katsioulas et al. |
| 6,613,661 B1 | 9/2003 | Baukus et al. |
| 6,740,942 B2 | 5/2004 | Baukus et al. |
| 6,748,579 B2 | 6/2004 | Dillon et al. |
| 6,774,413 B2 | 8/2004 | Baukus et al. |
| 6,791,191 B2 | 9/2004 | Chow et al. |
| 6,815,816 B1 | 11/2004 | Clark, Jr. et al. |
| 6,893,916 B2 | 5/2005 | Baukus et al. |
| 6,897,535 B2 | 5/2005 | Chow et al. |
| 6,919,600 B2 | 7/2005 | Baukus et al. |
| 6,924,552 B2 | 8/2005 | Baukus et al. |
| 6,940,764 B2 | 9/2005 | Clark, Jr. et al. |
| 6,944,843 B2 | 9/2005 | Bansal |
| 6,979,606 B2 | 12/2005 | Chow et al. |
| 7,008,873 B2 | 3/2006 | Chow et al. |
| 7,009,443 B2 | 3/2006 | Illegems |
| 7,042,752 B2 | 5/2006 | Okuda |
| 7,049,667 B2 | 5/2006 | Chow et al. |
| 7,170,317 B2 | 1/2007 | White |
| 7,217,977 B2 | 5/2007 | Chow et al. |
| 7,217,997 B2 | 5/2007 | Wyland |
| 7,279,936 B2 | 10/2007 | Gliese et al. |
| 7,328,419 B2 | 5/2008 | Vuong et al. |
| 7,383,521 B2 | 6/2008 | Smith et al. |
| 7,454,323 B1 | 11/2008 | Bain |
| 7,500,215 B1 | 3/2009 | Massabki et al. |
| 7,733,121 B2 | 6/2010 | Phoon et al. |
| 7,844,936 B2 | 11/2010 | Melzner |
| 7,895,548 B2 | 2/2011 | Lin et al. |
| 8,111,089 B2 | 2/2012 | Cocchi et al. |
| 8,168,487 B2 | 5/2012 | Clark, Jr. et al. |
| 9,479,176 B1 | 10/2016 | Eble, III et al. |
| 2002/0096744 A1 | 7/2002 | Chow et al. |
| 2002/0096776 A1 | 7/2002 | Chow et al. |
| 2004/0000928 A1 | 1/2004 | Cheng et al. |
| 2004/0061186 A1 | 4/2004 | Chow et al. |
| 2004/0103377 A1 | 5/2004 | Eaton et al. |
| 2004/0130349 A1 | 7/2004 | Morgenshtein et al. |
| 2004/0144998 A1 | 7/2004 | Chow et al. |
| 2005/0093572 A1 | 5/2005 | Sun et al. |
| 2005/0140389 A1 | 6/2005 | Gliese et al. |
| 2005/0161748 A1 | 7/2005 | Chow et al. |
| 2005/0230787 A1 | 10/2005 | Chow et al. |
| 2006/0075374 A1 | 4/2006 | McElvain |
| 2007/0261015 A1 | 11/2007 | Morgenshtein et al. |
| 2008/0216038 A1 | 9/2008 | Bose |
| 2008/0237644 A1 | 10/2008 | Tripathi |
| 2008/0282208 A1 | 11/2008 | Anderson et al. |
| 2010/0218158 A1 | 8/2010 | Chow et al. |
| 2010/0231263 A1 | 9/2010 | Fish et al. |
| 2011/0113392 A1 | 5/2011 | Chakraborty et al. |
| 2011/0148457 A1 | 6/2011 | Abramovici |
| 2015/0278419 A1 | 10/2015 | Yang et al. |
| 2016/0004808 A1 | 1/2016 | Feng et al. |

OTHER PUBLICATIONS

Renewed Petition under 37 C.F.R. §1.84(a)(2) dated Dec. 2, 2019 for U.S. Appl. No. 16/056,268.
Amendment under 37 C.F.R. 1.116 dated Dec. 2, 2019 for U.S. Appl. No. 16/056,268.
Final Office Action dated Jul. 20, 2019 for U.S. Appl. No. 16/056,268.
Non-Final Office Action dated Feb. 6, 2019 for U.S. Appl. No. 16/056,268.
PCT International Search Report and Written Opinion dated Jan. 16, 2018 for PCT Application No. PCT/US2017/052304.

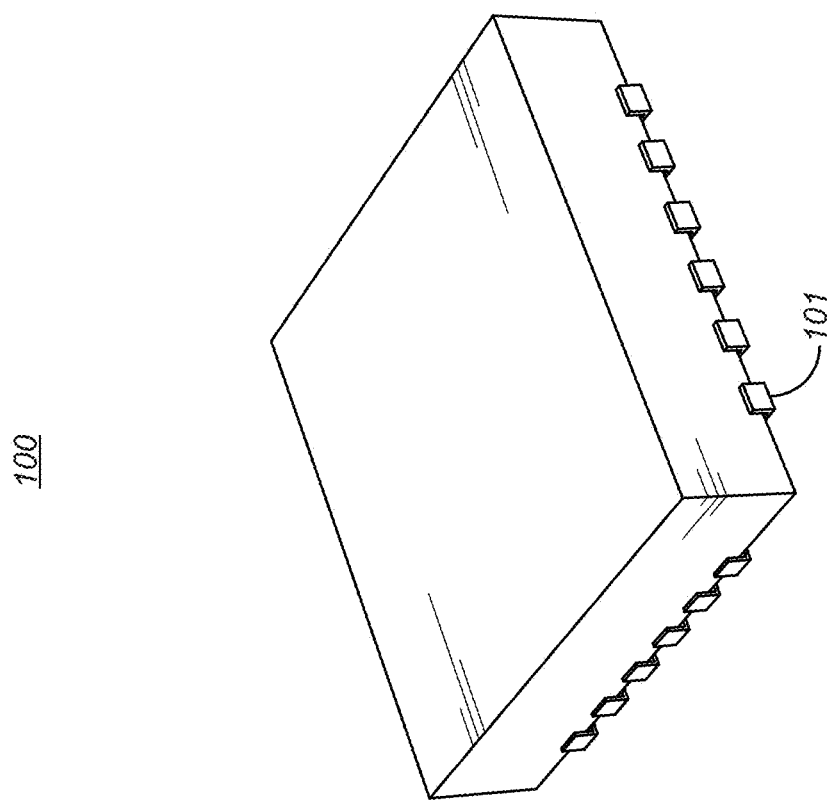

CAMOUFLAGED FINFET AND METHOD FOR PRODUCING SAME

CROSS-REFERENCE TO RELATED APPLICATIONS

This application is related to U.S. patent application Ser. No. 15/675,418, entitled "PHYSICALLY UNCLONABLE CAMOUFLAGE STRUCTURE AND METHODS FOR FABRICATING SAME," by Ronald P. Cocchi et al, filed Aug. 11, 2017 now issued as U.S. Pat. No. 10,574,237, which application is a continuation of U.S. patent application Ser. No. 14/985,270, by Ronald P. Cocchi et al., filed Dec. 30, 2015, now issued as U.S. Pat. No. 9,735,781, which application claims benefit of U.S. Provisional Patent Application No. 62/098,108, entitled "METHOD AND APPARATUS FOR BUILDING AN UNCLONABLE ELECTRONICS SYSTEM WITH CIRCUIT CAMOUFLAGE," by Ronald P. Cocchi, Lap W. Chow, James P. Baukus, and Bryan J. Wang, filed Dec. 30, 2014, which application is hereby incorporated by reference herein.

This application is also a related to U.S. patent application Ser. No. 13/940,585, entitled "METHOD AND APPARATUS FOR CAMOUFLAGING A STANDARD CELL BASED INTEGRATED CIRCUIT WITH MICRO CIRCUITS AND POST PROCESSING," by Bryan J. Wang, Lap Wai Chow, James P. Baukus, and Ronald P. Cocchi, filed Jul. 12, 2013, which application is a divisional of U.S. patent application Ser. No. 13/370,118, filed Feb. 9, 2012 and entitled "METHOD AND APPARATUS FOR CAMOUFLAGING A STANDARD CELL BASED INTEGRATED CIRCUIT WITH MICRO CIRCUITS AND POST PROCESSING," by Ronald P. Cocchi et al. and now issued as U.S. Pat. No. 8,510,700; which is:

- a continuation-in-part of U.S. patent application Ser. No. 12/380,094, filed Feb. 24, 2009 and entitled "CAMOUFLAGING A STANDARD CELL BASED INTEGRATED CIRCUIT," by Lap Wai Chow, James P. Baukus, Bryan J. Wang, and Ronald P. Cocchi, now issued as U.S. Pat. No. 8,151,235; and
- a continuation-in-part of U.S. patent application Ser. No. 12/578,441 filed Oct. 13, 2009 entitled "METHOD AND APPARATUS FOR CAMOUFLAGING A STANDARD CELL BASED INTEGRATED CIRCUIT," by Lap Wai Chow, James P. Baukus, Bryan J. Wang, and Ronald P. Cocchi, now issued as U.S. Pat. No. 8,418,091, which is a continuation-in-part of U.S. patent application Ser. No. 12/380,094, filed Feb. 24, 2009 and entitled "CAMOUFLAGING A STANDARD CELL BASED INTEGRATED CIRCUIT," by Lap Wai Chow, James P. Baukus, Bryan J. Wang, and Ronald P. Cocchi, now issued as U.S. Pat. No. 8,151,235;

This application is also related U.S. patent application Ser. No. 13/789,267, filed Mar. 7, 2013, entitled "METHOD AND APPARATUS FOR CAMOUFLAGING A STANDARD CELL INTEGRATED CIRCUIT," by Lap Wai Chow, James P. Baukus, Bryan J. Wang, and Ronald P. Cocchi, which application is a continuation of U.S. patent application Ser. No. 12/578,441, filed Oct. 13, 2009, entitled "METHOD AND APPARATUS FOR CAMOUFLAGING A STANDARD CELL BASED INTEGRATED CIRCUIT," by Lap Wai Chow, James P. Baukus, Bryan J. Wang, and Ronald P. Cocchi and now issued as U.S. Pat. No. 8,418,091, which application is a continuation-in-part of U.S. patent application Ser. No. 12/380,094, filed Apr. 3, 2012, entitled "CAMOUFLAGING A STANDARD CELL BASED INTEGRATED CIRCUIT," by Lap Wai Chow, James P. Baukus, Bryan J. Wang, and Ronald P. Cocchi, now issued as U.S. Pat. No. 8,151,235;

all of which forgoing applications are hereby incorporated by reference herein.

BACKGROUND

1. Field

The present disclosure relates to systems and methods for systems and methods for camouflaging digital circuits, and in particular to a camouflaged FinFET and a method for producing same.

2. Description of the Related Art

In today's standard-cell based application specific integrated circuit (ASIC) design, the logic function of the chip is modeled and simulated in higher-level hardware description languages (VHDL or VERILOG). It is then synthesized in a silicon compiler (e.g. SYNOPSIS) to generate a netlist using logic cells from a targeted standard-cell library. The netlist will be used in the backend physical design phase to perform the Place and Route of library cells, generating the full circuit layout of the ASIC for manufacturing. The Place and Route process uses an automated computer program placing all logic cells in appropriate locations, then connecting them with metal and via layers according to the connection information in the netlist. ASICs designed using this approach are vulnerable to reverse engineering (RE) attack. RE of an ASIC involves the steps of functional identification of logic cells and the extraction of the cells' connections. With the latest optical and scanning electron microscopic techniques, an ASIC's logic circuits and its wiring network can be easily extracted by RE.

In a standard Place and Route process of an ASIC, some unused silicon areas with no logic cells will usually occur during cell placement due to the requirement of efficient routing. The presence of the unused silicon areas provides extra information, like the cell boundaries, to the reverse engineering process. RE usually starts the functional identification of logic cells near the unused silicon areas of the ASIC.

The desire to protect hardware and associated intellectual property from reverse engineering and cloning has long been present in commercial and government applications. A conventional integrated circuit is susceptible to the aforementioned RE using a variety of techniques that analyze the manufactured silicon die and extract a functional circuit model. Once the functional circuit model is extracted, a counterfeit device can be produced that performs the same function as the original circuit, or a function that is intentionally altered with a Trojan circuit. Alternately, a digital circuit may then be emulated by an off-the-shelf microprocessor or Field Programmable Gate Array (FPGA).

Camouflage techniques have been used to protect logic cells in Application Specific Integrated Circuits (ASICs) against reverse engineering attacks since the late 1980s. Such systems attempt to fill open spaces in layers with metals and via that are appear functional, but are in fact non-functional. While such methods make RE difficult, additional techniques are needed to further discourage RE of such circuits.

What is needed is are additional techniques that can be used either independently from or in conjunction with the above techniques to further discourage RE. One such technique is disclosed in U.S. Pat. No. 9,735,781, (hereby incorporated by reference herein), which provides a structure for camouflage cells having RE-discernable layouts that are substantially indistinguishable from other functional logical cells and substantially indistinguishable from each other, even though such camouflage cells actually perform differently than other camouflage cells. Other patents, namely U.S. Pat. Nos. 7,217,977, 7,541,266 and 7,935,603 (also each incorporated by reference herein) describe the building of the non-operable transistors that are either 'Always-Off' or 'Always-On' in conventional planar CMOS technology. These non-operable devices can be used to build a camouflage cell library in which a number of camouflage cells are created based on the designs of various logic cells in a conventional logic cell library, incorporating these non-operable transistors to alter the cells' logic function. The camouflage cells, with the non-operable devices, appear to be identical to the normal logic standard cells, and are difficult to differentiate during reverse engineering.

With the latest developments in FinFET technology, the FinFET has replaced the conventional planar CMOS and has become the state-of-the-art semiconductor fabrication process for feature sizes of 22 nm and smaller. However, FinFET transistors have a different structure than conventional planar CMOS transistors, and the existing design layout techniques to fashion camouflaged devices are incompatible with FinFET designs.

What is needed is a system and method for defining, fabricating, and using camouflaged FinFETs. The methods and systems described herein satisfy that need.

SUMMARY

To address the requirements described above, this document discloses a camouflaged application specific integrated circuit (ASIC) and a method for fabricating such ASIC. In one embodiment, the camouflaged ASIC comprises a plurality of interconnected functional logic cells that together perform one or more ASIC logical functions, the plurality of interconnected functional logic cells comprising at least one camouflaged FinFET, comprising a fin. The fin comprises a source region of a first conductivity type, a drain region of the first conductivity type, a channel region of a second conductivity type, the channel region disposed between the source region and the drain region and a camouflaged fin region of the second conductivity type. The camouflaged Fin region at least partially rendering the camouflaged FinFET in an always-on condition and having a planar layout substantially indistinguishable from a fin region of an uncamouflaged FinFET.

Another embodiment is evidenced by a method of forming a camouflaged FinFET, comprising forming a fin that has a source region, a drain region, a channel region, and a camouflage region. The camouflage region has a source side extension region adjacent to the source side of the channel region, a drain side extension region adjacent to the drain side of the channel region, a source side span region between the source region and the source side extension region, and a drain side span region between the drain region and the drain side extension region. After forming the fin, the method further includes the steps of forming a gate over only the channel region of the FinFET, doping the source side extension region and the drain side extension region according to a first conductivity type, forming a source side gate spacer over the source side extension region and a drain side gate spacer over the drain side extension region, implanting the source side span region and the drain side span region according to the first conductivity type, implanting the source region and the drain region according to a second conductivity type, and forming salicide on the fin. Still another embodiment is evidenced by a camouflaged FinFET formed by the foregoing operations.

Still another embodiment is evidence by a camouflaged FinFET, comprising a fin and a gate, disposed over and perpendicular to the fin. The fin includes a source region of a first conductivity type, a drain region of the first conductivity type, a channel region of a second conductivity type, the channel region disposed between the source region and the drain region, and a camouflaged fin region of the second conductivity type, the camouflaged Fin region at least partially rendering the camouflaged FinFET in an always-on condition and having a planar layout substantially indistinguishable from a fin region of an uncamouflaged FinFET.

The features, functions, and advantages that have been discussed can be achieved independently in various embodiments of the present invention or may be combined in yet other embodiments, further details of which can be seen with reference to the following description and drawings.

BRIEF DESCRIPTION OF THE DRAWINGS

Referring now to the drawings in which like reference numbers represent corresponding parts throughout:

FIG. 1A is a diagram of an integrated circuit such as an application specific integrated circuit;

DESCRIPTION

In the following description, reference is made to the accompanying drawings which form a part hereof, and which is shown, by way of illustration, several embodiments. It is understood that other embodiments may be utilized, and structural changes may be made without departing from the scope of the present disclosure.

Overview

This invention describes a way of fabricating an 'Always-On' Transistor in FinFET technology. The technique involves the use of opposite Source and Drain (N+ and P+) and extension implants (N extension and P extension) in the active fin region. This new Always-On transistor has the same physical layout in major layers as a normal FinFET transistor so that the two appear to be physically identical under optical or electronic microscopy. An ASIC deigned with this type of Always-On transistor in the sea of normal transistors is highly resistant to reverse engineering attacks.

FIG. 1A is a diagram of an integrated circuit such as an application specific integrated circuit (ASIC) 100. The ASIC 100 comprises a plurality of pins 101, which together provide power and input signals to the ASIC and also provide output signals.

Figure 1B:
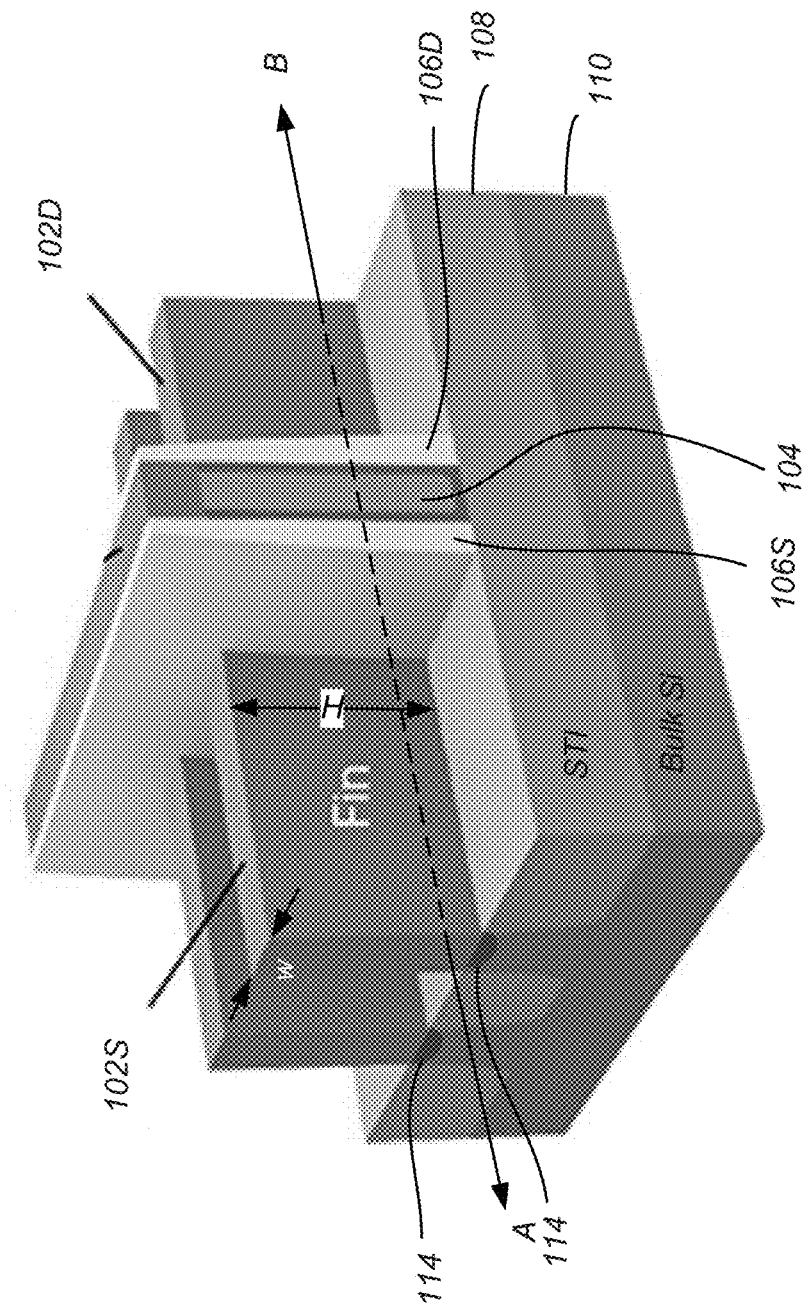
FIG. 1B is a diagram illustrating the basic structure of a standard FinFET transistor.

FIG. 1B is a diagram illustrating the basic structure of a standard FinFET transistor (hereinafter simply FinFET 200) in three dimensions. The FinFET 200 comprises a fin 102 formed on bulk silicon 110. A gate 104 having a source side gate spacer 106S and a drain side gate spacer 106D is disposed over and substantially perpendicular to the fin 102. A shallow trench isolation (STI) layer 108 may also be employed. Punch-through stop (PTS) implants 114 to improve the "off" performance of the FinFET by reducing the leakage current due to punch-through may also be utilized.

The standard bulk FinFET may be produced as follows. Fin material is formed on bulk silicon. One or more fins 102 of height H and width W is formed on bulk silicon 110, for example, by a lithographic etch. This is followed by a shallow trench isolation (STI) layer to fill the gaps between fins 102, then planarization and oxide recessing to expose the fins 102 as illustrated.

Transistor junctions can then be formed on 3 sides (top, left and right) of the exposed fin 102. Current FinFET technologies no longer form transistor junctions on the top side of the fin 102 due to its complexity and adverse effects. Instead, FinFETs are only built on the left and right sides of the fin 102.

Figure 2A:
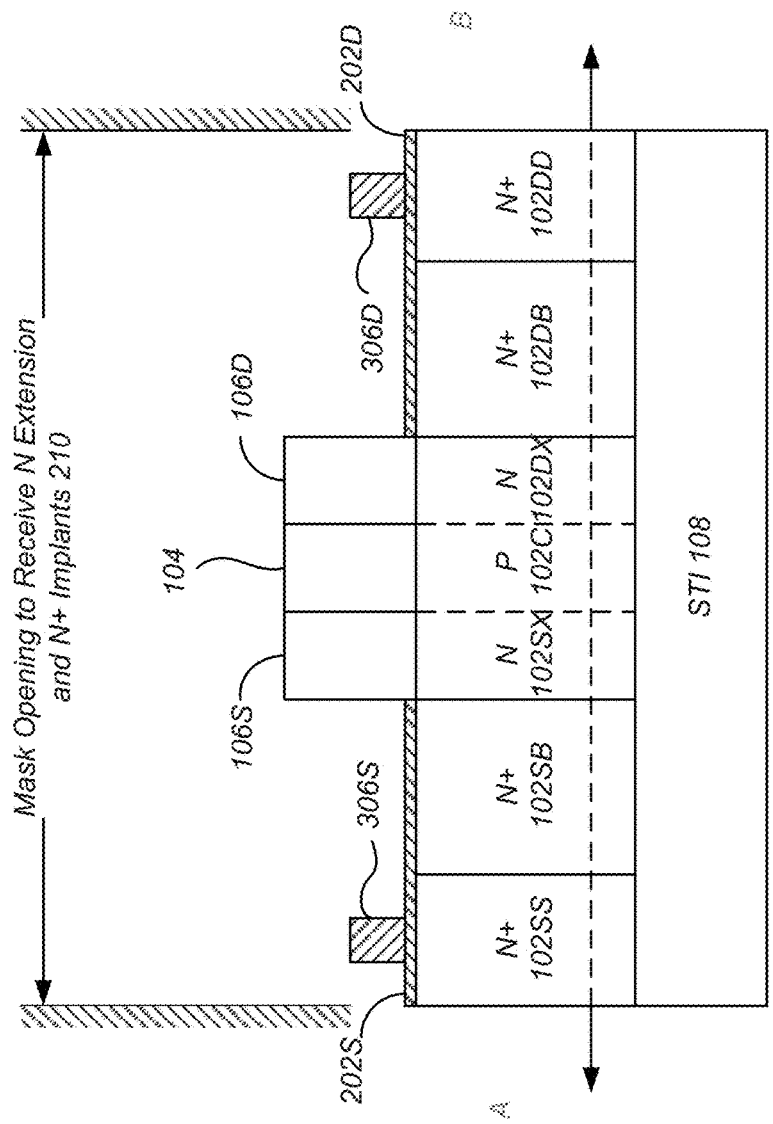
FIGS. 2A and 2B are diagrams illustrating a cross section of the exposed fin of a FinFET.
Figure 2B:
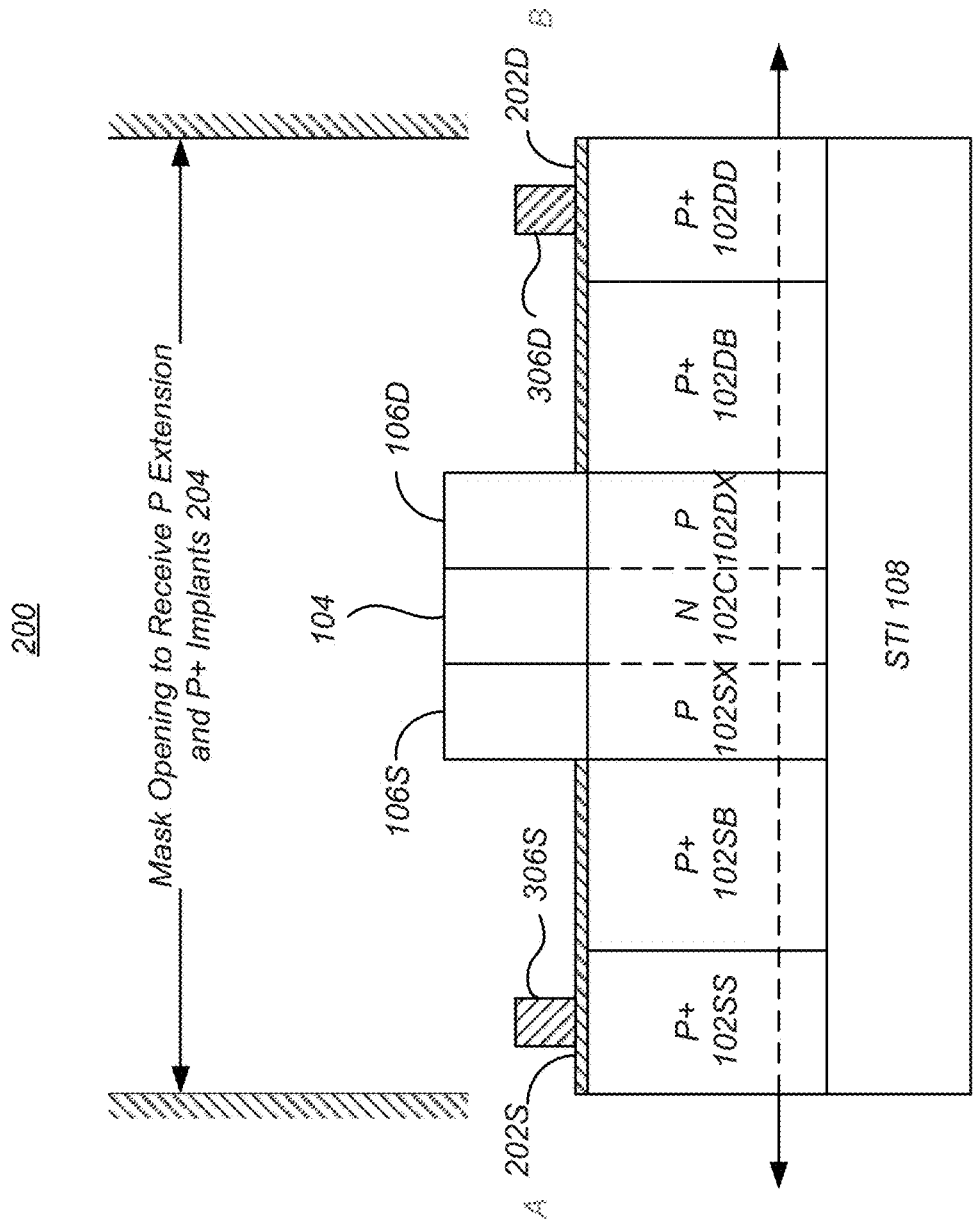

FIGS. 2A and 2B are diagrams illustrating a cross section of the exposed fin 102 of the FinFET. FIG. 2A depicts a side view of an N-type FinFET along axis A-B, and FIG. 2B depicts a side view of a P-type FinFET along the same axis.

Well implants are placed to give the correct dopants to the channel region 102C of the fin 102. P well implants are placed in the embodiment depicted in FIG. 2A and N well implants are depicted in the embodiment depicted in FIG. 2B. A punch through stop (PTS) implant may accompany the well implantation. The location of the PTS implants are not shown FIGS. 2A and 2B, as they are behind the STI 108 and not visible in this view. However, their location is analogous to the PTS implants 114 illustrated in FIG. 1B.

Next, a gate dielectric is grown and a deposition of polysilicon as a dummy gate follows. The dummy gate will be later replaced by a metal gate (104) at the end of the process. After the dummy gate formation, source and drain extension implant is carried out by use of a mask 210 for N-type FinFET in FIG. 2A and mask 204 for P-type FinFET in FIG. 2B having the extent along the A-B axis.

The extension implant covers the source side extension region 102SX and the drain side extension region 102DX. The extension implant also covers the source, source span, drain and drain span regions, but this low dose implant is insignificant in these regions as they will subsequently receive dramatically higher dose implants. This is accomplished for the N channel of the N-type device depicted in FIG. 2A and for the P channel of the P-type device depicted in FIG. 2B. Halo implants may be added at this time together with the extension implant, for further device leakage control.

Next, gate spacers 106S and 106D are formed on both sides of the dummy poly gate 104 (source side gate spacer 106S and drain side gate spacer 106D). The gate spacers 106S and 106D cover the source side extension region 102SX and drain side extension region 102DX, respectively, and the silicon regions under the spacers are protected by the spacers from receiving the N+/P+ implants and that will increase the breakdown voltage and reduce the "short channel effect".

Then, N+ source and drain implant is provided to source region 102SS, and the drain region 102DD to the N-type device of FIG. 2A, with a P+ source and drain implant provided to analogous regions in the P-type device illustrated in FIG. 2B. To enhance carrier mobility of the channels, selective growth of epi-SiGe is implemented on the source region 102SS and drain region 102DD of the N-type device shown in FIG. 2A. Similarly, selective growth of epi-Si:C is implemented on the source region 102SS and drain region 102DD of the P-type device of FIG. 2B.

Self-aligned metal silicide (salicide) 202 is then deposited over the source and drain silicon areas (102SS and 102DD respectively) on the surface of the fin regions 102S and 102D to reduce source and drain resistance and to provide a good electrical connection with the FinFET device. The dummy poly gate is then removed and replaced with a high K dielectric and gate metal. The properties of the high K dielectric material are chosen for proper threshold voltage control of the FinFET. Finally, self-aligned contacts 306 are deposited to make an electrical connection with the source region 102SS, drain region 102DD and gate 104.

Camouflaged FinFET

Figure 3A:
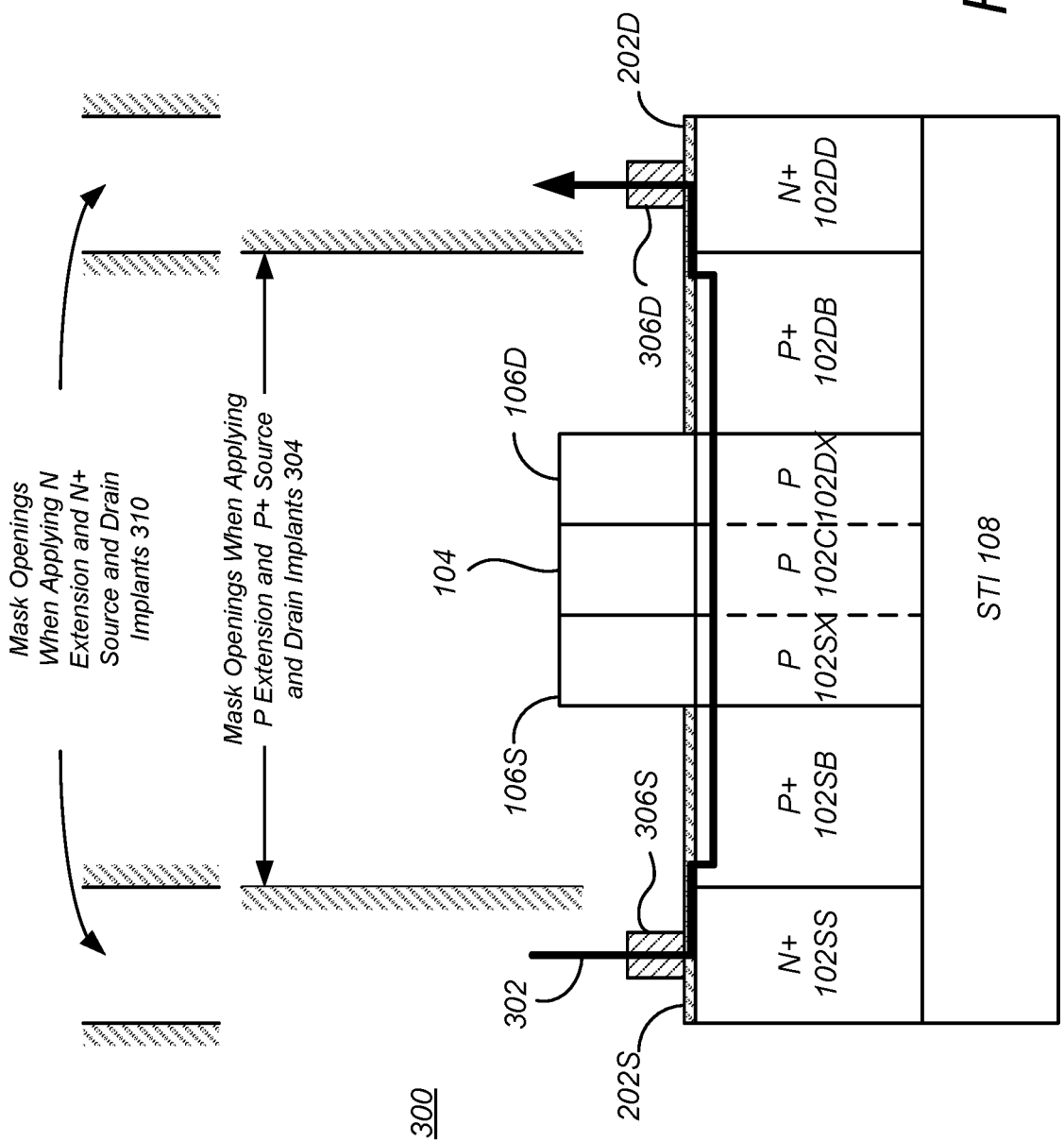
FIGS. 3A and 3B are diagrams illustrating exemplary camouflaged FinFETs.
Figure 3B:
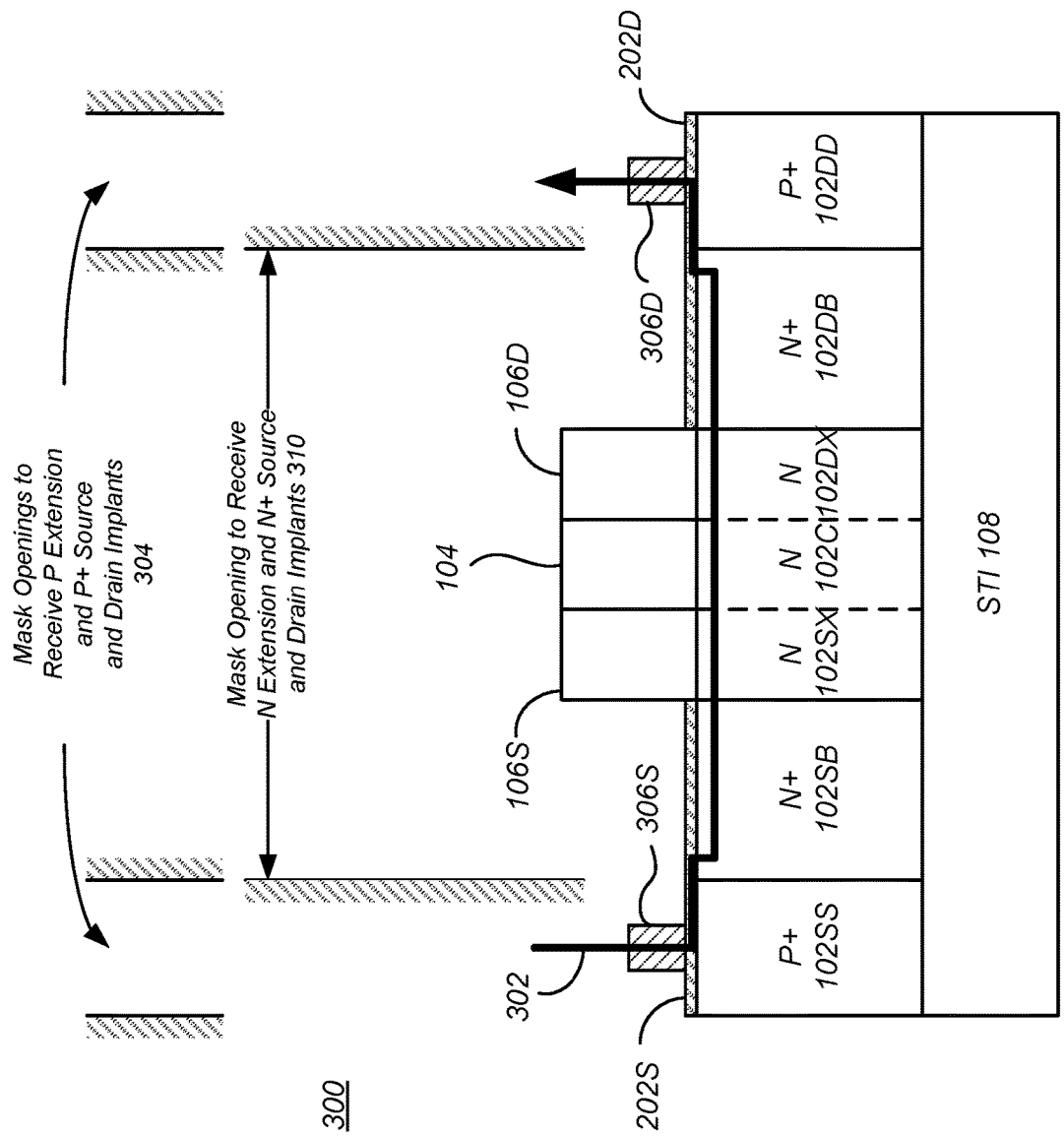

FIGS. 3A and 3B are diagrams illustrating exemplary camouflaged FinFETs 300. The camouflaged FinFET 300 is in an "always-on" state in which the device is always on and providing a conductive path from the source to the drain regardless of the voltage applied to the gate. FIG. 3A illustrates an exemplary embodiment of an N-type always on FinFET 300, while FIG. 3B illustrates an exemplary embodiment of a P-type always on FinFET 300. Such FinFETs 300 are used to produce functional logic cells that together perform the functions of the ASIC 100 described above.

The camouflaged FinFET 300 comprises a fin 102. In the illustrated embodiment, the fin includes a source region 102SS of a first conductivity type, a drain region 102DD of the first conductivity type, a channel region 102C of a second conductivity type, and a camouflaged fin region that includes a camouflaged source side fin region (collectively 102SB, 102SX) of the second conductivity type and a camouflaged drain side fin region 102DX and 102DD), also of the second conductivity type. The camouflaged fin region at least partially renders the FinFET 300 in an "always on" condition, yet has a planar layout (size, location, and material composition of the elements of the FinFET 300 viewed from above) that is substantially indistinguishable from a fin region of an uncamouflaged and ordinary functioning FinFET 200. In this context, "substantially indistinguishable" planar layouts are those which are commercially impracticable to discern from uncamouflaged physical layouts. The camouflaged source side span region 102SB is disposed adjacent to and between the source region 102SS and the source side extension region 102SX, and the camouflaged drain side span region 102DB is disposed adjacent to and between the drain side extension region 102DX. In the illustrated embodiment, the camouflaged FinFET 300 also comprises a silicide layer 202, including a source side silicide layer 202S and a drain side silicide layer 202D. Thus the extension implant's dosage of the camo device is the same as the normal device.

FIGS. 3A and 3B also illustrate a conduction path 302 by which electricity is passed through the FinFET 300, rendering the device in an always on state. As illustrated, the conduction path 302 is from the aligned contact 306S in electrical communication with the source side silicide layer 202S adjacent the source region 102SS of the FinFET 300, through the source side silicide layer 202S on the source side, through the camouflaged source side fin region (including the source span region 102SB and the source side extension region 102SX), through the channel region 102C, and through the camouflaged drain side fin region (including the drain side extension region 102DX and the drain side span region 102DB), through the silicide layer on the drain side 202D to an aligned drain side contact 306D in electrical communication with the silicide layer 202D adjacent the source region 102SS. The silicide layer 202 facilitates a conductive path from the aligned source side contact 306S to the camouflaged source side span region 102SB and from the camouflaged drain side span region 102DB to the drain side contact 306D. The camouflaged, always on N type or P type FinFETs 300 are built with a change of the mask design used to create the N/P type source and drain side implant layers of extension regions 102SX and 102DX and the source and drain side N+/P+ type source and drain side implant layers of the spanning regions 102SB and 102DB. In uncamouflaged devices employed digital circuits, N and P extension implant layers are not used as design layers. Instead their layer information on masks is generated from the design information of N+/P+ source and drain (S/D) implants.

For example, in uncamouflaged FinFETs 200 shown in FIGS. 2A and 2B, the mask used for the source side extension region 102SX and the drain side extension region 102DX (e.g. the extension implant masks) are the same as the implant masks used for the source region 102SS and the drain region 102DD (source/drain implant masks). That is, in the uncamouflaged N-type FinFET 200 shown in FIG. 2A, regions receiving N+ source/drain implants (regions 102SS and 102DD) also receive N extension implants (in regions 102SX and 102DX). Similarly, in the uncamouflaged P-type FinFET 200 shown in FIG. 2B, regions receiving P+ source/drain implants (regions 102SS and 102DD) also receive P extension implants (in regions 102SX and 102DX).

For the uncamouflaged FinFETs 200 in FIGS. 2A and 2B, the whole fin 102 receives N+ implants for N-type FinFETs and P+ implants for P-type FinFETs. Regions underneath the gate spacers 106S and 106D will only have the extension implants and are denoted as N and P in FIGS. 2A and 2B respectively, because they are shielded from the source/drain N+/P+ implants by the spacers 106 which are grown after the N and P type extension implants are made to extension regions 102SX and 102DX.

The camouflaged always-on FinFET 300 is fabricated by use of changes to the N+ and P+ masks to convert a normal FinFET 200 to become an Always-On transistor, changes that are made at the center part of the gate area and extend further into both the source and drain.

This is shown in FIGS. 3A and 3B. For example, in FIG. 3A, instead of having the entire exposed (e.g. excluding those portions protected by the gate 104 and gate spacers 106) fin receive N extension and N+ S/D implants (using mask 310), the camouflaged FinFET 300 design is changed to have the channel (gate) region 102C plus portions 102SB and 102SX of the source side of the fin 102S and portions 102DX and 102DB of the drain side 102D of the fin receive implants of the opposite type from the uncamouflaged FinFET 200. In the example shown in FIG. 3A, mask 304 permits P extension and P+ implants to be provided on the exposed source and drain side of the fin (including source side span region 102SB, source side extension region 102SX, drain side extension region 102DX and drain side span region 102DB, but prevents such implants to the source region 102SS and the drain region 102DD. The remainder of the source and drain sides of the FinFET 300 (source region 102SS and drain region 102DD) are provided the same N+ implants. FIG. 3B illustrates an analogous example for a P-type FinFET with the P extension and P+ S/D implants using mask 304.

Due to the presence of silicide layer 202 formed in the later process steps, the P+ to N+ junctions in both the source and drain regions are shorted electrically by the silicide. For example, referring to FIG. 3A, source side silicide layer 202S shorts the source region 102SS to the camouflaged source side span region 102SB and drain side silicide layer 202D shorts the drain region 102DD to the drain side span region 102DB. Further, since the source side span region 102SB the source side extension region 102SX, the drain side extension region 102DX and the drain side span region 102DB are of the same doping type as the channel region 102C (e.g. they are P doped) and the channel region 102C under the gate 104 is P doped by the well implants, a conduction path between the source side contact 306S and drain side contact 306D exists all the time independent of the voltage at the gate 104. The result is a device in which current can always pass through the source side contact 306S and drain side contact 306D and thus an 'always-on' FinFET 300 is created. The same applies to the device shown in FIG. 3B which illustrates another embodiment (P-type) of a camouflaged 'always-on' FinFET 300 is illustrated.

Figure 4A:
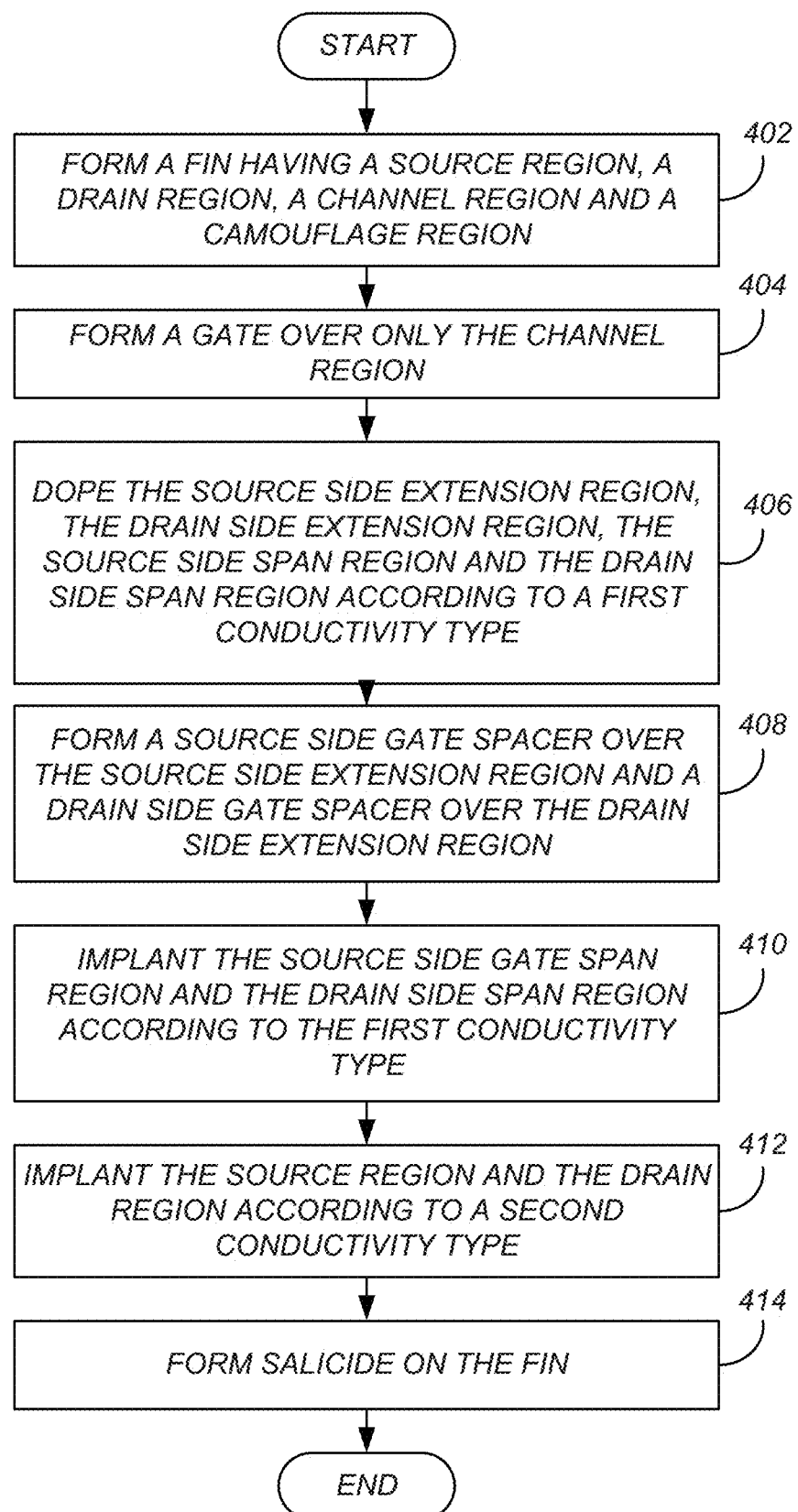
FIGS. 4A-4C are diagrams illustrating an exemplary process for fabricating an always-on N-type or P-type FinFET.
Figure 4B:
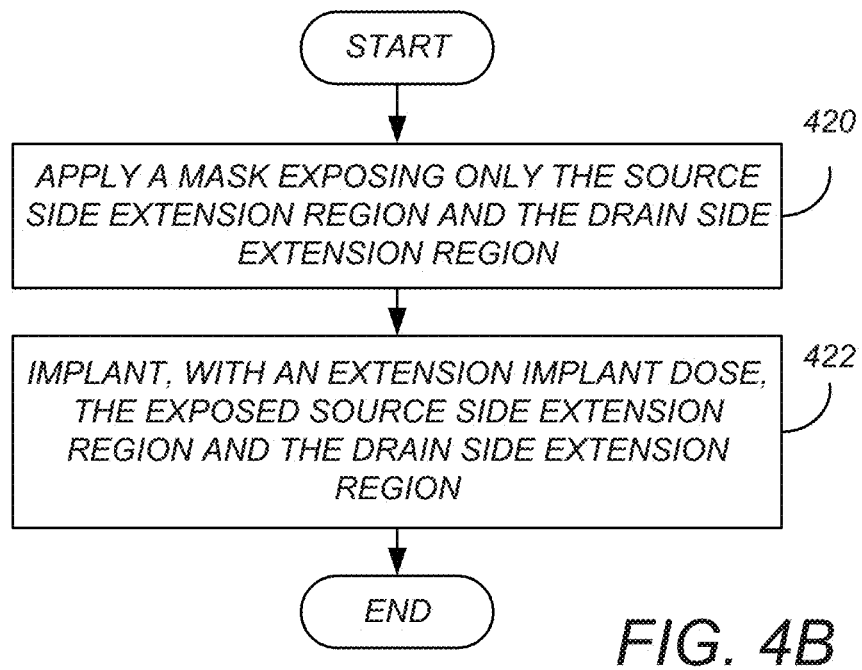
Figure 4C:
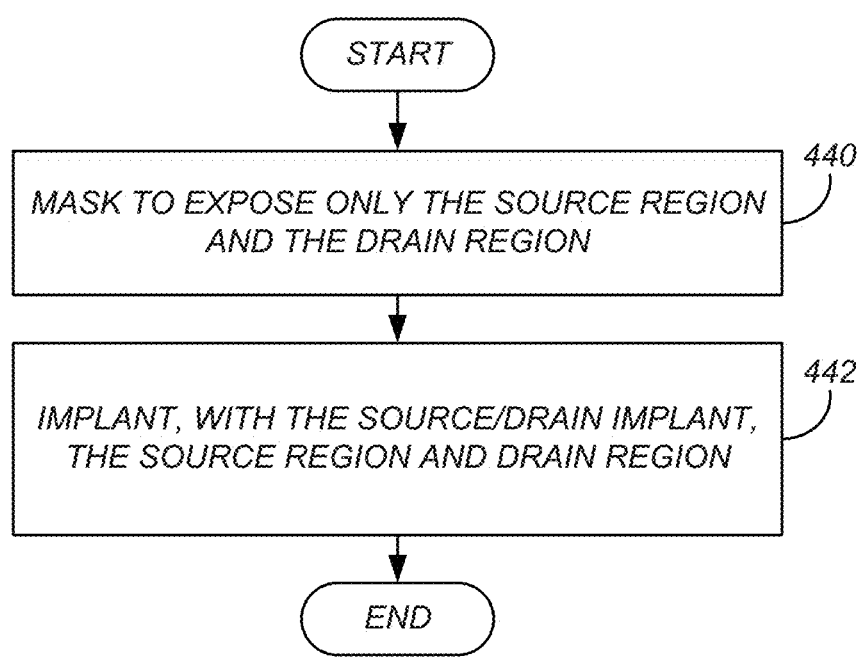

FIGS. 4A-4C are diagrams illustrating an exemplary process for fabricating an always-on N-type or P-type FinFET 300. In block 402, a fin 102 is formed having a source region 102SS, a drain region 102DD, a channel region 102C, and a camouflage region (102SB, 102SX, 102DX and 102DB). The camouflage region comprises a source side extension region 102SX and a source side span region 102SB on a source side 102S of the gate 104 and a drain side 102D and a drain side extension region 102DX and a drain side span region 102DB on the drain side 102D of the gate 104.

Well implants are placed to give the correct dopants to the channel region 102C of the fin 102. P well implants are placed in the embodiment depicted in FIG. 3A and N well implants are depicted in the embodiment depicted in FIG. 3B. As with the uncamouflaged FinFET 200, a punch through stop (PTS) implant targeted the bottom part of fin 102 may accompany this well implantation. The PTS implant improves the "off" performance of the FinFET 300 by reducing the leakage current due to punch through.

Next, a gate 104 is formed over only the channel region 102C of the FinFET, as shown in block 404. In block 406, the source side extension region 102SX, the drain side extension region 102DX, the source side span region 102SB and the drain side span region 102DB are doped according to a first conductivity type.

FIG. 4B is a diagram illustrating one embodiment of how the source side extension region 102SX, the drain side extension region 102DX, the source side span region 102SB and the drain side span region 102DB are doped according to a first conductivity type. In block 420, a mask 304 used such that only the source side extension region 102SX, the drain side extension region 102DX, the source side span region 102SB and the drain side span region 102DB are exposed (the channel region 102C is covered by the gate 104 formed in block 404). In block 422, the exposed source side extension region 102SX and drain side extension region 102DX are implanted with an extension implant dose.

Returning to FIG. 4A, in block 408, a source side gate spacer 106S is formed over the source side extension region 102SX and a drain side gate spacer 106D is formed over the drain side extension region 102DX. Next, as shown in block 410, the source side span region 102SB and the drain side span region 102DB is implanted according to the first conductivity type.

In block 410, the source side span region 102SB and the drain side span region 102DB are implanted according to the first conductivity type. Note that since source side gate spacer 106S and drain side gate spacer 106D prevent the source side extension region 102SX and the drain side extension region 102DX from being exposed, the same mask 304 is used in for the implant operation.

Returning to FIG. 4A, the source region 102SS and the drain region 102DD are implanted according to a second conductivity type, as shown in block 412.

FIG. 4C is a diagram illustrating one embodiment of how the source region and the drain regions are implanted according to the second conductivity type. In block 440, a mask 310 is employed to expose only the source region and the drain region. Then, in block 442, the source and drain regions are implanted with a source/drain implant.

Finally, returning to FIG. 4A, salicide is formed on the source side fin region 102S and drain side fin 102D, as shown in block 414.

Importantly, the foregoing process does not require additional masking steps over those of an uncamouflaged FinFET. Instead, the opening or apertures in the masks used in existing processes have been altered to obtain the desired always-off functionality.

Further, it is important to note that the FinFET is typically one of a large plurality of FinFETs disposed on an ASIC, the plurality of FinFETs are formed concurrently with each masking, doping and implanting operation. Also, since the first conductivity type of a P-type FinFET is also the second conductivity type of an N-type FinFET, and the second conductivity type of a P-type FinFET is also the first conductivity type of a P-type FinFET, the block areas of one type of device are implanted at the same time, with the same mask, as the source and drain areas of the opposite type device.

For example, consider an ASIC with an N-type conventional FinFET illustrated in FIG. 2A, an always-on FinFET illustrated in FIG. 3A, a P-type conventional FinFET illustrated in FIG. 2B, and an always-on FinFET illustrated in FIG. 3B. The mask 310 applied to create the N+ source and drain implants of the N-type always-on FinFET of FIG. 3A is also used to create the P extension and P+ source and drain implants of the P-type always-on FinFET of FIG. 3B and the mask 304 used to create the P extension and P+ source and drain implants of the P-type always-on FinFET of FIG. 3B is also used to apply the P extension and P+ source and drain implants of the N-type always-on FinFET of FIG. 3A.

Hardware Environment

Figure 5:
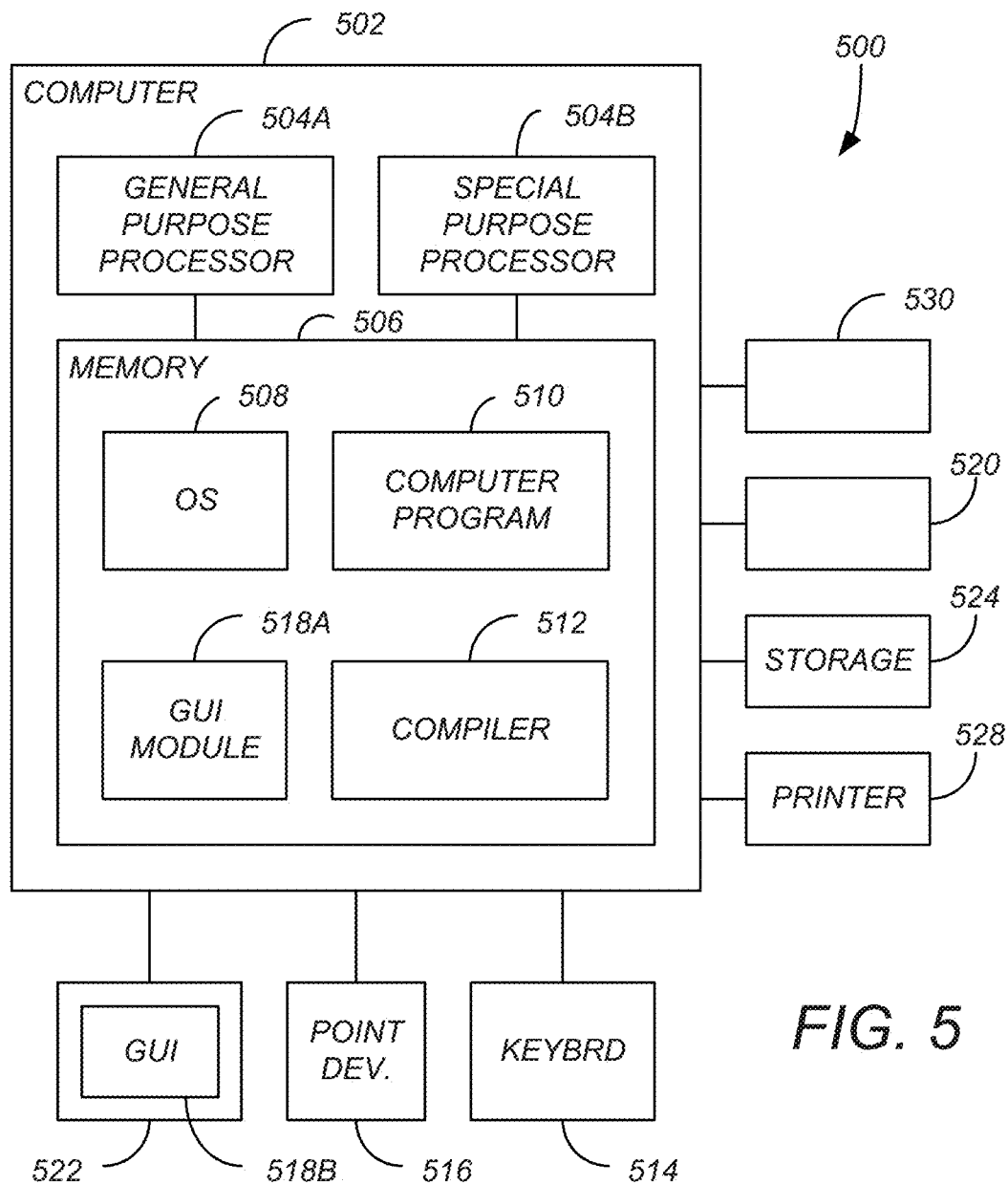
FIG. 5 illustrates an exemplary computer system that could be used to implement processing elements of the geolocation system.

FIG. 5 illustrates an exemplary computer system 500 that could be used to implement processing elements of the above disclosure, including a computer used to control devices used in fabricating the FinFET. The computer 502 comprises a processor 504 and a memory, such as random access memory (RAM) 506. The computer 502 is operatively coupled to a display 522, which presents images such as windows to the user on a graphical user interface 518B. The computer 502 may be coupled to other devices, such as a keyboard 514, a mouse device 516, a printer 528, etc. Of course, those skilled in the art will recognize that any combination of the above components, or any number of different components, peripherals, and other devices, may be used with the computer 502.

Generally, the computer 502 operates under control of an operating system 508 stored in the memory 506, and interfaces with the user to accept inputs and commands and to present results through a graphical user interface (GUI) module 518A. Although the GUI module 518B is depicted as a separate module, the instructions performing the GUI functions can be resident or distributed in the operating system 508, the computer program 510, or implemented with special purpose memory and processors. The computer 502 also implements a compiler 512 which allows an application program 510 written in a programming language such as COBOL, C++, FORTRAN, or other language to be translated into processor 504 readable code. After completion, the application 510 accesses and manipulates data stored in the memory 506 of the computer 502 using the relationships and logic that was generated using the compiler 512. The computer 502 also optionally comprises an external communication device such as a modem, satellite link, Ethernet card, or other device for communicating with other computers.

In one embodiment, instructions implementing the operating system 508, the computer program 510, and the compiler 512 are tangibly embodied in a computer-readable medium, e.g., data storage device 520, which could include one or more fixed or removable data storage devices, such as a zip drive, floppy disc drive 524, hard drive, CD-ROM drive, tape drive, etc. Further, the operating system 508 and the computer program 510 are comprised of instructions which, when read and executed by the computer 502, causes the computer 502 to perform the operations herein described. Computer program 510 and/or operating instructions may also be tangibly embodied in memory 506 and/or data communications devices 530, thereby making a computer program product or article of manufacture. As such, the terms "article of manufacture," "program storage device" and "computer program product" as used herein are intended to encompass a computer program accessible from any computer readable device or media.

Those skilled in the art will recognize many modifications may be made to this configuration without departing from the scope of the present disclosure. For example, those skilled in the art will recognize that any combination of the above components, or any number of different components, peripherals, and other devices, may be used.

CONCLUSION

This concludes the description of the preferred embodiments of the present disclosure.

The foregoing description of the preferred embodiment has been presented for the purposes of illustration and description. It is not intended to be exhaustive or to limit the disclosure to the precise form disclosed. Many modifications and variations are possible in light of the above teaching. It is intended that the scope of rights be limited not by this detailed description, but rather by the claims appended hereto.

What is claimed is:

1. A camouflaged application specific integrated circuit (ASIC), comprising:
    a plurality of interconnected functional logic cells that together perform one or more ASIC logical functions, the plurality of interconnected functional logic cells comprising:
        at least one camouflaged FinFET, comprising a fin having:
            a source region of a first conductivity type;

a drain region of the first conductivity type;
a channel region of a second conductivity type, the channel region disposed between the source region and the drain region; and
a camouflaged fin region of the second conductivity type, the camouflaged fin region at least partially rendering the camouflaged FinFET in an always-on condition and having a planar layout substantially indistinguishable from a fin region of an uncamouflaged FinFET.

2. The ASIC of claim 1, further comprising a silicide layer disposed on the camouflaged fin region, the silicide layer further rendering the camouflaged FinFET in an always on condition.

3. The ASIC of claim 2, wherein the camouflaged Fin region comprises:
a camouflaged source side fin region of the second conductivity type, disposed between the source region and the channel region; and
a camouflaged drain side fin region of the second conductivity type, disposed between the drain region and the channel region.

4. The ASIC of claim 3, wherein:
the camouflaged source side fin region comprises:
a camouflaged source side extension region adjacent a source side of the channel region, the camouflaged source side extension region being a lightly doped region of the second conductivity type; and
the camouflaged drain side fin region comprises:
a camouflaged drain side extension region adjacent a drain side of the channel region, the camouflaged drain side extension region being a lightly doped region of the second conductivity type.

5. The ASIC of claim 4, wherein:
the camouflaged source side fin region further comprises a camouflaged source side span region disposed between the source region and the camouflaged source side extension region; and
the camouflaged drain side fin region further comprises a camouflaged drain side span region disposed between the drain region and the camouflaged drain side extension region.

6. The ASIC of claim 5, wherein:
the camouflaged FinFET is rendered in the always on condition by a conduction path from the source region through the silicide layer, the camouflaged source side span region, the camouflaged source side extension region, the channel region, the camouflaged drain side extension region, the camouflaged drain side span region, and the drain region.

7. The ASIC of claim 6, wherein the first and second conductivity type are selected from the group consisting of a P conductivity type and an N conductivity type, and wherein:
the first conductivity type is one of the P conductivity type and the N conductivity type; and
the second conductivity type is the other of the P conductivity type and the N conductivity type.

8. A method of forming a camouflaged application specific integrated circuit (ASIC), comprising a plurality of interconnected functional logic cells that together perform one or more ASIC logical functions, the plurality of interconnected functional logic cells comprising at least one camouflaged FinFET, comprising:
forming a fin, the fin having:
a source region of a first conductivity type;
a drain region of the first conductivity type;
a channel region of a second conductivity type, the channel region disposed between the source region and the drain region; and
a camouflage fin region of the second conductivity type, the camouflaged fin region at least partially rendering the camouflaged FinFET in an always-on condition and having a planar layout substantially indistinguishable from a fin region of an uncamouflaged FinFET, the camouflaged fin region having:
a source side extension region adjacent to a source side of the channel region;
a drain side extension region adjacent to a drain side of the channel region;
a source side span region between the source region and the source side extension region; and
a drain side span region between the drain region and the drain side extension region;
forming a gate over only the channel region of the camouflaged FinFET;
doping the source side extension region and the drain side extension region according to a first conductivity type;
forming a source side gate spacer over the source side extension region and a drain side gate spacer over the drain side extension region;
implanting the source side span region and the drain side span region according to the first conductivity type;
implanting the source region and the drain region according to a second conductivity type; and
forming self-aligned silicide on the fin.

9. The method of claim 8, wherein:
doping the source side extension region and the drain side extension region according to the first conductivity type comprises:
applying a mask exposing only the source side extension region, the drain side extension region, the source side span region and the drain side span region of the camouflaged FinFET;
implanting, with an extension implant dose, the exposed source side extension region the drain side extension region, the source side span region and the drain side span region; and
implanting the source side span region and the drain side span region according to the first conductivity type comprises:
implanting, with a source/drain implant, the exposed source side span region and the exposed drain side span region using the mask;
implanting the source region and the drain region according to the second conductivity type comprises:
applying a second mask to expose the source region and the drain region of the camouflaged FinFET; and
implanting, with the source/drain implant, the source region and the drain region.

10. The method of claim 9, wherein the first and second conductivity type are selected from the group consisting of a P conductivity type and an N conductivity type, and wherein:
the first conductivity type is one of the P conductivity type and the N conductivity type; and
the second conductivity type is the other of the P conductivity type and the N conductivity type.

11. A camouflaged application specific integrated circuit (ASIC), formed by a process comprising process steps of:
forming a plurality of FinFETs, each FinFET concurrently formed by performing process steps comprising the steps of:
forming a fin having:

a source region;
a drain region;
a channel region; and
a camouflage region having:
a source side extension region adjacent to a source side of the channel region;
a drain side extension region adjacent to a drain side of the channel region;
a source side span region between the source region and the source side extension region; and
a drain side span region between the drain region and the drain side extension region;
forming a gate over only the channel region of the FinFET;
doping the source side extension region and the drain side extension region according to a first conductivity type;
forming a source side gate spacer over the source side extension region and a drain side gate spacer over the drain side extension region;
implanting the source side span region and the drain side span region according to the first conductivity type;
implanting the source region and the drain region according to a second conductivity type; and
forming self-aligned silicide on the fin.

12. The ASIC of claim 11, wherein:
doping the source side extension region and the drain side extension region according to the first conductivity type comprises:
applying a mask exposing only the source side extension region, the drain side extension region, the source side span region and the drain side span region of the FinFET;
implanting, with an extension implant dose, the exposed source side extension region and the drain side extension region;
implanting the source side span region and the drain side span region according to the first conductivity type comprises:
implanting, with a source/drain implant, the exposed source side span region and the exposed drain side span region using the mask;
implanting the source region and the drain region according to the second conductivity type comprises:
applying a second mask to expose the source region and the drain region of the camouflaged FinFET; and
implanting, with the source/drain implant, the source region and the drain region.

13. The ASIC of claim 12, wherein the first and second conductivity type are selected from the group consisting of a P conductivity type and an N conductivity type, and wherein:
the first conductivity type is one of the P conductivity type and the N conductivity type; and
the second conductivity type is the other of the P conductivity type and the N conductivity type.

14. A camouflaged FinFET, comprising:
a fin having:
a source region of a first conductivity type;
a drain region of the first conductivity type;
a channel region of a second conductivity type, the channel region disposed between the source region and the drain region;
a camouflaged fin region of the second conductivity type, the camouflaged fin region at least partially rendering the camouflaged FinFET in an always-on condition and having a planar layout substantially indistinguishable from a fin region of an uncamouflaged FinFET;
a gate, disposed over and perpendicular to the fin.

15. The camouflaged FinFET of claim 14, further comprising a silicide layer disposed on the camouflaged fin region, the silicide layer further rendering the camouflaged FinFET in an always on condition.

16. The camouflaged FinFET of claim 15, wherein the camouflaged Fin region comprises:
a camouflaged source side fin region of the second conductivity type, disposed between the source region and the channel region; and
a camouflaged drain side fin region of the second conductivity type, disposed between the drain region and the channel region.

17. The camouflaged FinFET of claim 16, wherein:
the camouflaged source side fin region comprises:
a source side extension region adjacent a source side the channel region, the source side extension region being a lightly doped region of the second conductivity type; and
the camouflaged drain side fin region comprises:
a drain side extension region adjacent a drain side of the channel region, the drain side extension region being a lightly doped region of the second conductivity type.

18. The camouflaged FinFET of claim 17, wherein:
the camouflaged source side fin region further comprises a source side span region disposed between the source region and the source side extension region; and
the camouflaged drain side fin region further comprises a drain side span region disposed between the drain region and the drain side extension region.

19. The camouflaged FinFET of claim 18, wherein:
the camouflaged FinFET is rendered in the always on condition by a conduction path from the source region through the silicide layer, the source side span region, the source side extension region, the channel region, the drain side extension region, the drain side span region, and the drain region.

20. The camouflaged FinFET of claim 19, wherein the first and second conductivity type are selected from the group consisting of a P conductivity type and an N conductivity type, and wherein:
the first conductivity type is one of the P conductivity type and the N conductivity type; and
the second conductivity type is the other of the P conductivity type and the N conductivity type.

* * * * *